United States Patent [19]

Jang et al.

[11] Patent Number: 5,786,262
[45] Date of Patent: Jul. 28, 1998

[54] SELF-PLANARIZED GAPFILLING FOR SHALLOW TRENCH ISOLATION

[75] Inventors: S. M. Jang; Y. H. Chen, both of Hsinchu; C. H. Yu, Keelung, all of Taiwan

[73] Assignee: Taiwan Semiconductor Manufacturing Co., Ltd., Hsinchu, Taiwan

[21] Appl. No.: 838,606

[22] Filed: Apr. 9, 1997

[51] Int. Cl.$^6$ ................................ H01L 21/76
[52] U.S. Cl. ............... 438/424; 438/427; 438/435; 438/437; 438/221; 438/296; 148/DIG. 50
[58] Field of Search .................... 438/424, 427, 438/435, 437, 221, 296; 148/DIG. 50

[56] References Cited

U.S. PATENT DOCUMENTS

| | | |
|---|---|---|
| 5,498,565 | 3/1996 | Gocho et al. ........................ 438/427 |
| 5,578,518 | 11/1996 | Koike et al. ........................ 148/DIG. 50 |
| 5,665,635 | 9/1997 | Kwon et al. ........................ 438/437 |

*Primary Examiner*—Trung Dang
*Attorney, Agent, or Firm*—Merchant Gould Smith Edell Welter and Schmidt

[57] ABSTRACT

A new method is disclosed to form a shallow trench isolation with a ozone-TEOS as a gapfilling material. The formation of the shallow trench isolation described herein includes a pad layer, a silicon nitride layer formed on a semiconductor substrate. A thermal oxide layer is subsequently formed on the silicon nitride layer. Then a shallow trench is created via photolithography and dry etching steps to etch the thermal oxide layer, the silicon nitride layer and the pad layer. After photoresist is removed, an ozone-TEOS layer is form in the shallow trench and on the top of the thermal oxide layer for the purpose of isolation. A CMP is perform to make the surface of the substrate with a planar surface. Then, a thermal annealing is used for densification of the ozone-TEOS layer and for forming a lining oxide to provide better isolation.

20 Claims, 5 Drawing Sheets

SELF-PLANARIZED GAPFILLING FOR SHALLOW TRENCH ISOLATION

FIELD OF THE INVENTION

The present invention relates to a method of isolation for integrated circuit (IC), and more specifically, to a method of self-planarized gapfilling for shallow trench isolation.

BACKGROUND OF THE INVENTION

The formation of electric circuits involves connecting isolated devices through specific electric paths. Typically, to manufacture ICs, devices isolation from one another must first be created in the silicon substrate. A variety of isolation technologies have been proposed such as LOCOS (LOCal Oxidation of Silicon), shallow trench isolation (STI) and so on. Shallow trench isolation is gaining popularity for quarter-micron technology and beyond to replace the conventional LOCOS process. The LOCOS involves the formation of Field OXides (FOX) in the nonactive regions of the substrate. As device geometry reaches submicron size, conventional LOCOS isolation has a limitation. For example, the bird's beaks structure causes unacceptably large encroachment of the field oxide into the device active regions. Further, the planarity of the surface topography is inadequate for submicron lithography needs. Therefore, trench isolation is one of the newer approaches adopted.

Trench isolation is used primarily for isolating devices in VLSI and ULSI, and hence they can be considered as replacement for conventional LOCOS isolation. In the basic shallow trench isolation (STI) technology, shallow trenches are anisotropically etched into the silicon substrate. Next, a CVD oxide is deposited onto the substrate and is then planarization by CMP (Chemical Mechanical Polishing) or etching back. Another way of the technology is called a Buried OXide with Etch-Stop process (BOXES). The process uses a silicon-nitride etch-stop layer and a pad layer formed on the substrate before the CVD-oxide is deposited.

The method of forming the conventional shallow trench isolation (STI) is described as followed. Turning to FIG. 1, a silicon oxide layer 3 is formed on a substrate 1 for using as a pad layer. The thickness of the silicon oxide layer 3 is about 50–500 angstroms. Then, a silicon-nitride layer 5 having 500–5000 angstroms is deposited on the pad layer 3.

Turning to FIG. 2, a photoresist 7 is patterned on the silicon-nitride layer 5 to define a trench region. Turning next to FIG. 3, a shallow trench 9 is created by etching. The depth of the shallow trench is about 2000–8000 angstroms from the surface of the silicon-nitride layer 5. Then the photoresist 7 is removed away while the shallow trench 9 is formed.

Referring to FIG. 4, a silicon oxide layer 11 is deposited on the silicon-nitride layer 5 and is refilled into the shallow trench 9 for using as an isolation. Typically, the thickness of the silicon oxide layer 11 is about 1000 to 20000 angstroms. Referring to FIG. 5, a chemical mechanical polishing (CMP) technology is then performed for planarization to the surface of the silicon nitride layer 5.

Unfortunately, the planarization of shallow trench isolation relies on chemical mechanical polishing (CMP) which has been proven an effective but challenging process. The challenges associated with CMP for STI include dishing of wide trench, erosion of small nitride, and oxide remaining on large nitride. The dishing degrades the planarity of a layer, and it also impacts the control of implantation. The area used for isolated device may be eroded by silicon nitride. This will damage the Si substrate and devices that are fabricated here. The oxide that remains on the silicon nitride layer makes wet strip of silicon nitride unlikely.

SUMMARY OF THE INVENTION

A new method is disclosed to form a shallow trench isolation (STI) with ozone-TEOS to act as a gapfilling material. A thin silicon dioxide layer is formed on a silicon substrate. Subsequently, a silicon nitride layer is deposited on the silicon dioxide layer. The silicon nitride layer can be deposited by any suitable process. Then, a thermal oxide layer is formed on the silicon nitride layer. The thermal oxide layer is formed by growing high temperature oxide (HTO). Alternatively, it also can be formed by depositing a polysilicon or amorphous silicon layer on the silicon nitride layer. Then, a thermal oxidation is used to oxidize the poly or amorphous silicon.

A photoresist is patterned on the thermal oxide layer to define a trench region. A shallow trench is generated by using etching to etch the thermal oxide layer, silicon nitride layer, the pad layer and the substrate. Then the photoresist is stripped away after the shallow trench is generated.

An ozone-TEOS layer is used for serving as the gapfilling material to refill into the trench for isolation. The ozone-TEOS is surface sensitivity on silicon oxide. The ozone-TEOS has the higher growing rate while it is formed on the silicon than formed on the poly oxide. A chemical mechanical polishing (CMP) technology is then utilized to remove a portion of the ozone-TEOS layer to the surface of the silicon nitride layer for planarization. Then, a thermal annealing is performed in oxygen ambient for densification of the ozone-TEOS. The temperature of the thermal annealing is about 1000° to 1100° C. The densification not only improves the ozone-TEOS quality but also grows a lining oxide that is underlying the ozone-TEOS.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A new method is disclose to form a shallow trench isolation (STI) with ozone-TEOS for serving as a gapfilling material. The ozone-TEOS is surface sensitivity on silicon dioxide, therefore, the ozone-TEOS can be used for self-aligned gapfilling. As will be seen below, this technique can be used to form a self-planarized gapfilling for STI.

Figure 1:
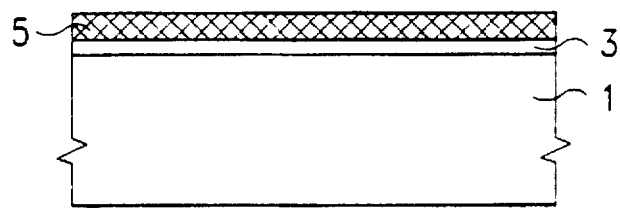
FIG. 1 is a cross section view of a semiconductor wafer illustrating the step of forming a pad oxide and a stop layer on a substrate in accordance with prior art.
Figure 2:
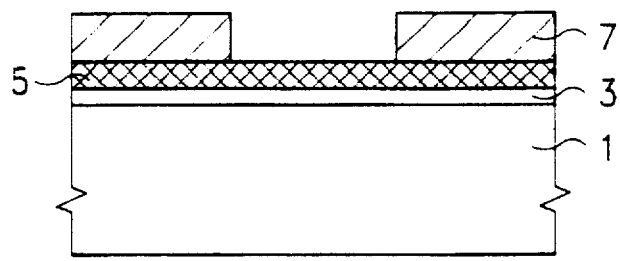
FIG. 2 is a cross section view of a semiconductor wafer illustrating the step of patterning a photoresist on the stop layer in accordance with prior art.
Figure 3:
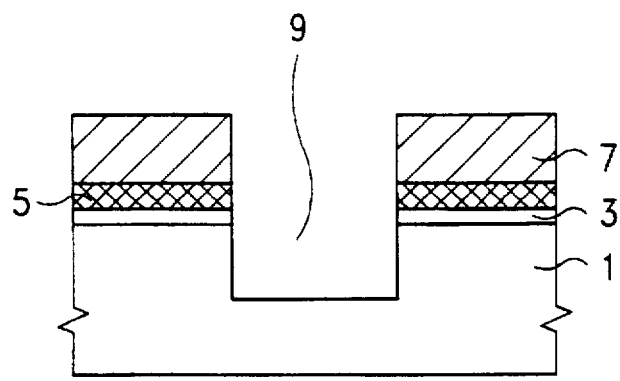
FIG. 3 is a cross section view of a semiconductor wafer illustrating the step of forming a shallow trench in the substrate in accordance with prior art.
Figure 4:
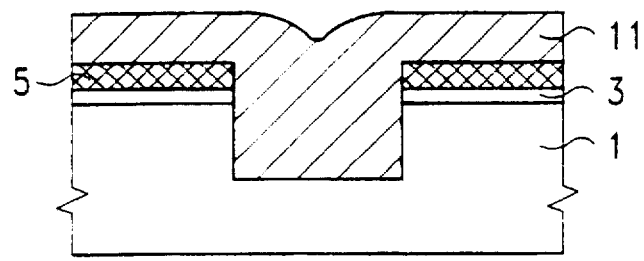
FIG. 4 is a cross section view of a semiconductor wafer illustrating the step of forming a silicon dioxide layer on the stop layer in accordance with prior art.
Figure 5:
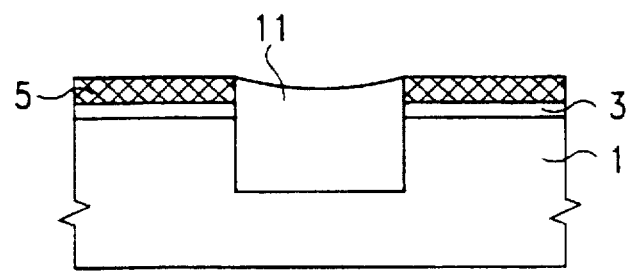
FIG. 5 is a cross section view of a semiconductor wafer illustrating the step of performing a CMP process on the silicon dioxide layer in accordance with prior art.
Figure 6:
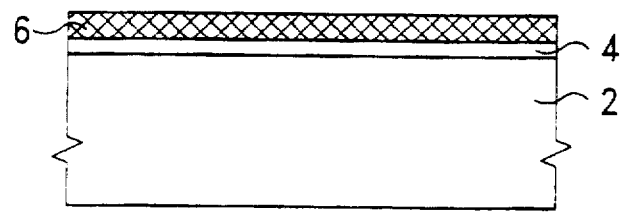
FIG. 6 is a cross section view of a semiconductor wafer illustrating the step of forming a pad oxide, a silicon nitride layer and a thermal oxide layer on a substrate in accordance with the present invention.

Referring to FIG. 6, in the preferred embodiment a silicon substrate 2 can be p type or n type silicon with <100> crystallographic orientation. A thin silicon dioxide layer 4 is formed on the substrate 2 to act as a pad layer. The silicon dioxide 4 is typically formed by using a thermal oxidation in an oxygen ambient or any suitable process. The thickness of the silicon dioxide layer 4 is about 50 to 150 angstroms. Subsequently, a silicon nitride layer 6 is deposited on the pad layer 4 to serve as a stop layer for subsequent chemical mechanical polishing (CMP).

The silicon nitride layer 6 can be deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). The thickness of the silicon nitride layer is about 500 to 2000 angstroms. Further, the temperature to form the silicon nitride layer 6 is at a range of 400°–800° C. The temperatures for the PECVD, LPCVD are about 400°–500° C. and 500°–800° C., respectively. In the preferred embodiment, the reaction gases of the step to form silicon nitride layer 6 are $SiH_4$, $NH_3$, $N_2$, $N_2O$ or $SiH_2Cl_2$, $NH_3$, $N_2$, $N_2O$.

Subsequently, a thermal oxide layer 8 is formed on the silicon nitride layer 6 to a thickness about 500 to 2000 angstroms. The thermal oxide layer 8 is form by growing high temperature oxide (HTO). The reaction gases are $SiH_4$ and $O_2$. Alternatively, it also can be formed by depositing a polysilicon or amorphous silicon layer on the silicon nitride layer 6. Then, a thermal oxidation is carried out to oxidize the poly or amorphous silicon. The thermal oxide layer 8 is used herein for a purpose that will be described later.

Figure 7:
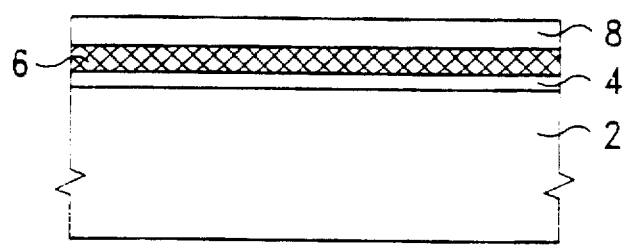
FIG. 7 is a cross section view of a semiconductor wafer illustrating the step of forming a shallow trench in the substrate in accordance with the present invention.

Turning to FIG. 7, a photoresist is patterned on the thermal oxide layer 8 to expose a trench region. A shallow trench 10 is created via a dry etching process. The thermal oxide layer 8, silicon nitride layer 6, the pad layer 4 and the substrate 2 can respectively be etched by controlling the recipe. The depth of the shallow trench is about 5000 to 10000 angstroms from the surface of the thermal oxide layer 6. Then the photoresist is stripped away after the shallow trench 10 is generated.

Figure 8:
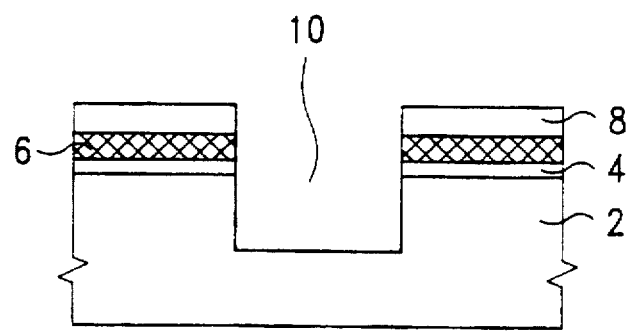
FIG. 8 is a cross section view of a semiconductor wafer illustrating the step of forming a ozone-TEOS in the shallow trench and on the thermal oxide layer in accordance with the present invention.
Figure 9:
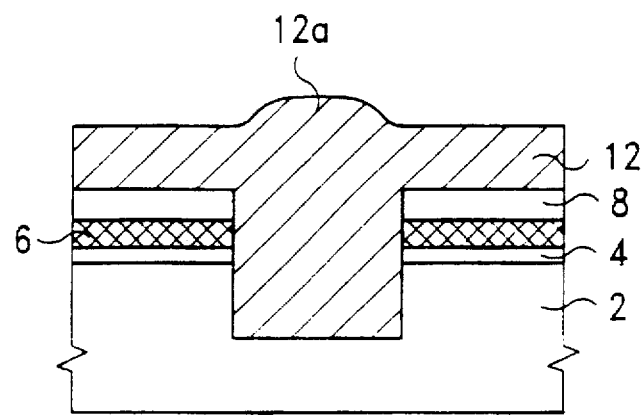
FIG. 9 is a cross section view of a semiconductor wafer illustrating the step of performing a chemical mechanical polishing to the ozone-TEOS layer in accordance with the present invention.
Figure 11:
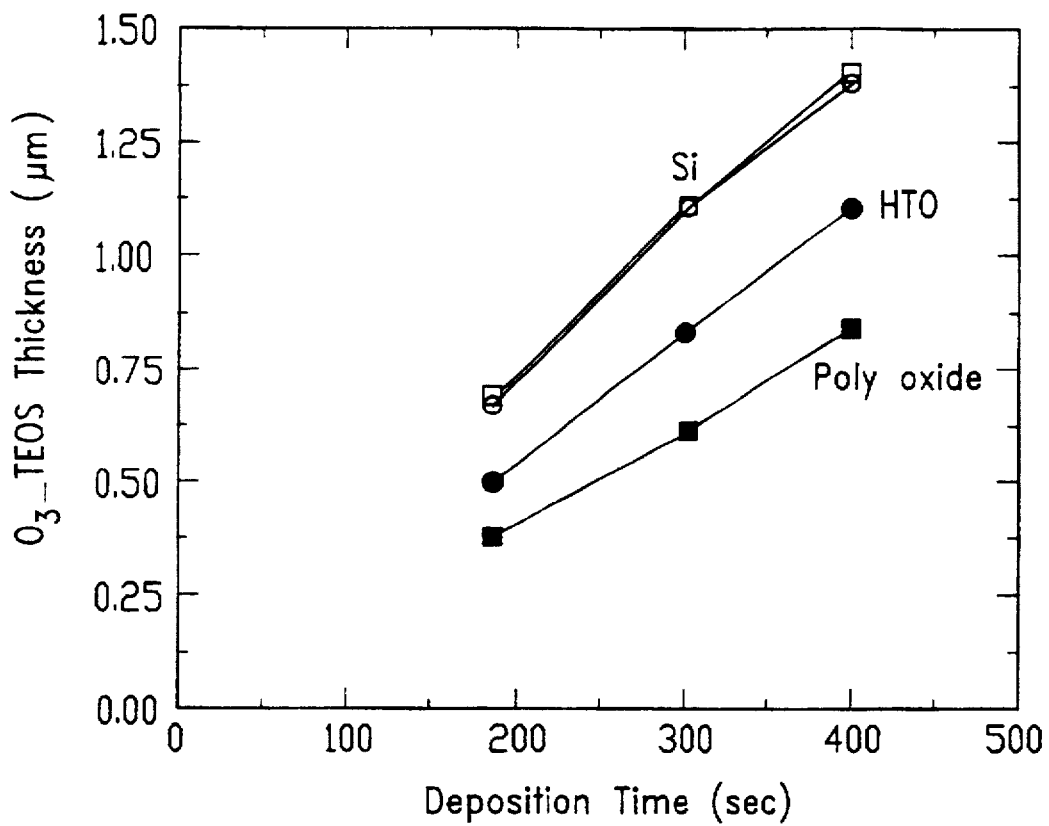
FIG. 11 shows the growing rate of the ozone-TEOS formed on different material, respectively.

As shown in FIG. 8, gapfilling material is refilled into the trench 10 for isolation. In the preferred embodiment, an ozone-TEOS layer 12 is used to serve as the gapfilling material. Turning to FIG. 11, it is a drawing to show the growing rate of ozone-TEOS formed on silicon, HTO and poly oxide, respectively. The ozone-TEOS is surface sensitivity on silicon oxide. In the drawing, it can be seen that the ozone-TEOS has the highest growing rate while it is formed on the silicon. Conversely, it has the slowest growing rate while it is formed on the poly oxide. The reason of forming the thermal oxide layer 8 is to make sure the ozone-TEOS layer formed over the trench 10 with higher thickness due to higher growing rate. In FIG. 9, the ozone-TEOS (the protrude portion 12a) formed on the silicon substrate 2 is thicker than the neighboring ozone-TEOS 12 formed on the thermal oxide layer 8. Thus, although the removing rate of CMP over the trench region is faster than its neighboring regions, since the $O_3$-TEOS portion 12a is thicker than the neighboring regions 12, there will be no dishing issue. Other conventional problem such as the erosion issue will also be eliminated by this method. In other words, the result of CMP will be improved by this method. Preferably, the ozone-TEOS is formed by using sub-atmospheric chemical vapor deposition (SACVD) at a temperature in the range of about 400° to 480° C. The molar ratio of $O_3$ to form the ozone-TEOS is about 12 wt %, the flowing rates of TEOS and He are about 25 sccm, 2300 sccm, respectively. Further, the flowing rates of $O_2$ is 5000 sccm.

Referring to FIG. 9, a chemical mechanical polishing (CMP) technology is then utilized to remove a portion of the ozone-TEOS layer 12 to the surface of the silicon nitride layer 6 for planarization. Thus the STI is formed by present invention. The CMP can be easily controlled to stop at the surface of the silicon nitride layer 6.

Figure 10:
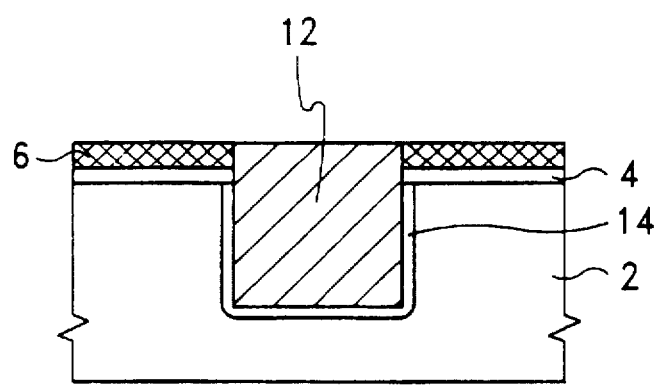
FIG. 10 is a cross section view of a semiconductor wafer illustrating the step of performing a thermal annealing in oxygen ambient for densification of SACVD ozone-TEOS in accordance with the present invention.

Turning to FIG. 10, a thermal annealing is performed in oxygen ambient for densification of SACVD ozone-TEOS for about 30 to 120 minutes. The temperature of the thermal annealing is about 1000° to 1100° C. The densification not only improves the ozone-TEOS 2 quality but also grows a lining oxide 14 that is underlying the ozone-TEOS 2. The benefit of the lining oxide 14 is that it can provide better isolation.

As is understood by a person skilled in the art, the foregoing preferred embodiment of the present invention is illustrated of the present invention rather than limiting of the present invention. For example, the present invention uses the SACVD ozone-TEOS with surface sensitivity on silicon oxide to improve the result of CMP. The silicon oxide layer can be formed by HTO or alternatively, it can be formed by depositing a polysilicon or amorphous silicon layer on the silicon nitride layer. Then, a thermal oxidation is used to form silicon oxide. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a shallow trench isolation on a silicon wafer, said method comprising:
   forming a pad layer on said wafer;
   forming a silicon nitride layer on said pad layer;
   forming a thermal oxide layer on said silicon nitride layer;
   forming a shallow trench by etching portions of said thermal oxide layer, said silicon nitride layer, said pad layer and said silicon wafer;

forming an ozone-TEOS layer for isolation on said thermal oxide layer and refilling into said shallow trench, said ozone-TEOS layer that is formed over said trench being thicker than said ozone-TEOS layer that is formed on said thermal oxide layer; and removing a portion of said ozone-TEOS layer by using chemical mechanical polishing to expose the surface of said silicon nitride layer, therefore planarizing said ozone-TEOS layer.

2. The method of claim 1, further comprises the step of performing a thermal annealing for densification of said ozone-TEOS layer and for forming a lining oxide to provide better isolation.

3. The method of claim 1, further comprises the following steps of forming said shallow trench:

patterning a photoresist on said thermal oxide layer to define a shallow trench region; and etching said thermal oxide layer, said silicon nitride layer, said pad layer and said silicon substrate by using said photoresist as a mask; and removing said photoresist.

4. The method of claim 1, wherein said ozone-TEOS layer is formed by sub-atmospheric CVD.

5. The method of claim 4, wherein the reaction materials of forming said ozone-TEOS are $O_3$, TEOS, $O_2$ and He, the flowing rates of said TEOS being 25 sccm, the flowing rate of said He being 2300 sccm, the flowing rates of said $O_2$ being 5000 sccm, the molar ratio of said $O_3$ being 12 wt %.

6. The method of claim 5, wherein said ozone-TEOS layer is formed at a temperature in the range of about 400° to 480° C.

7. The method of claim 4, wherein said thermal oxide layer is formed by using HTO.

8. The method of claim 4, wherein said thermal oxide layer is formed by using following steps:

forming a silicon layer on said silicon nitride layer; and performing a thermal oxidation for oxidizing said silicon to form said thermal oxide.

9. The method of claim 8, wherein said silicon layer is polysilicon or amorphous silicon.

10. The method of claim 8, wherein the thickness of said thermal oxide layer is about 500 to 2000 angstroms.

11. The method of claim 1, wherein said pad layer is composed of silicon dioxide.

12. The method of claim 11, wherein the thickness of said pad layer is about 50 to 500 angstroms.

13. The method of claim 1, wherein said silicon nitride layer is formed by a method selected from the group consisting of Low Pressure Chemical Vapor Deposition (LPCVD), Plasma Enhance Chemical Vapor Deposition (PECVD) or High Density Plasma Chemical Vapor Deposition (HDPCVD).

14. The method of claim 13, wherein the reaction gases of forming said silicon nitride layer are $SiH_4$, $NH_3$, $N_2$, $N_2O$.

15. The method of claim 13, wherein the reaction gases of forming said silicon nitride layer are $SiH_2Cl_2$, $NH_3$, $N_2$, $N_2O$.

16. The method of claim 13, wherein the temperature of forming said silicon nitride layer is about 400°–800° C.

17. The method of claim 1, wherein the thickness of said silicon nitride layer is about 500 to 2000 angstroms.

18. The method of claim 2, wherein said thermal annealing is carried out in oxygen ambient.

19. The method of claim 18, wherein the temperature of said thermal annealing is about 1000° to 1100° C.

20. The method of claim 19, wherein said thermal annealing is performed about 30 to 120 minutes.

* * * * *